United States Patent
Bensahel et al.

(10) Patent No.: US 6,690,027 B1
(45) Date of Patent: Feb. 10, 2004

(54) METHOD FOR MAKING A DEVICE COMPRISING LAYERS OF PLANES OF QUANTUM DOTS

(75) Inventors: Daniel Bensahel, Grenoble (FR); Yves Campidelli, Grenoble (FR); Caroline Hernandez, Grenoble (FR)

(73) Assignee: France Télécom, Paris (FR)

(*) Notice: Subject to any disclaimer, the term of this patent is extended or adjusted under 35 U.S.C. 154(b) by 0 days.

(21) Appl. No.: 10/048,719

(22) PCT Filed: Jul. 11, 2000

(86) PCT No.: PCT/FR00/02000

§ 371 (c)(1),
(2), (4) Date: Jun. 13, 2002

(87) PCT Pub. No.: WO01/08225

PCT Pub. Date: Feb. 1, 2001

(30) Foreign Application Priority Data

Jul. 26, 1999 (FR) .............................. 99 09646

(51) Int. Cl.$^7$ .............................................. H01L 27/06
(52) U.S. Cl. .......................................... 257/14; 438/409
(58) Field of Search ................ 257/14, 15, 19, 257/E33.015, E33.009, E33.018, E29.071, E29.075; 438/960, 962, 409

(56) References Cited

U.S. PATENT DOCUMENTS

| 5,293,050 A | | 3/1994 | Chapple-Sokol et al. | |
| 5,696,629 A | * | 12/1997 | Berger et al. | 359/582 |
| 5,757,024 A | * | 5/1998 | Fathauer et al. | 257/19 |
| 5,970,361 A | * | 10/1999 | Kumomi et al. | 438/409 |

FOREIGN PATENT DOCUMENTS

| DE | 43 19 413 A1 | 12/1994 | |
| FR | 2620571 | * 3/1989 | H01L/21/84 |
| WO | 96/30951 | 10/1996 | |

OTHER PUBLICATIONS

Tang et al., Light Emitters and Detectors, Oct. 3, 1996, World Intellectual Property Organization, 1–15.*
Gardelis et al., Evidence for quantum confinement in the photlouminescence of porous Si and SiGe, Oct. 21, 1991, Applied Physics Letters, 59(17), 2118–2120.*
Kienzle et al., Germanium "quantum dots" embedded in silicon: Quantitiative study of self–alignment and coarsening, Jan. 11, 1999, Applied Physics Letters, 74 (2), 269–271.*
S. Gardelis et al: "Evidence for quantum confinement in the photoluminescence of porous Si and SiGe", Applied Physics Letters 59(17), US, Woodbury, NY: American Institute of Physics, Oct. 21, 1991, pp 2118–2120, XP000407024 ISBN: 0003–6951.

* cited by examiner

*Primary Examiner*—Douglas A. Wille
(74) *Attorney, Agent, or Firm*—Meyertons, Hood, Kivlin, Kowert & Goetzel, P.C.; Eric B. Meyertons

(57) ABSTRACT

A method for forming on a Ge or Si monocrystalline substrate successive Si/Ge, Si/SiGe, or Si/SiGe/Ge layers for a Ge substrate and inversely for a Si substrate is described. Electrochemical treatment of the stack of layers to make the layers porous and form therein residual crystallites is also described. The invention may be used to provide devices having layers of planes of quantum drops.

18 Claims, 2 Drawing Sheets

METHOD FOR MAKING A DEVICE COMPRISING LAYERS OF PLANES OF QUANTUM DOTS

BACKGROUND OF THE INVENTION

1. Field of the Invention

Figure 1A:
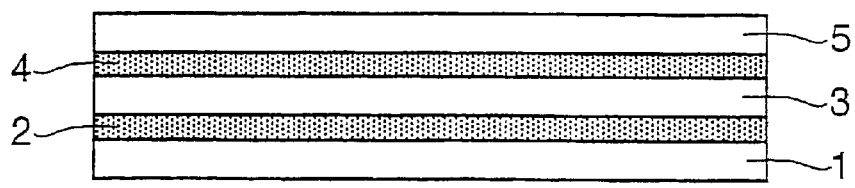

The present invention relates in general to a process for fabricating, on a single-crystal silicon or germanium substrate, a stack of silicon and/or germanium quantum box planes and to a device comprising a single-crystal silicon or germanium substrate and a stack of quantum box planes, the size of which is variable in each plane but oriented.

2. Description of the Related Art

At the present time, the formation of silicon quantum boxes has been the subject of many studies. These quantum boxes are generally composed of a single-crystal materials of less than 100 nm in size.

Conventionally, quantum boxes are produced in the form of semi-hemispherical dots approximately 20 nm in length at the base and from 2 to 3 nm in height and are made of III–V compounds. III–V compounds have the advantage of exhibiting direct energy bandgaps (and therefore exhibiting a high efficiency in luminescence for example) but they are difficult to treat and integrate.

In contrast, silicon is a well-controlled material from the standpoint of both its treatment and its integration. However, its indirect energy bandgap is a major handicap in the case of applications requiring high luminescence efficiency. This explains the little interest that this material has aroused in applications of the quantum-box type.

The possibility of coupling silicon (Si) with germanium (Ge) or silicon-germanium alloys (SiGe) has rekindled interest in obtaining quantum boxes made of IV—IV material, that is to say mainly Si or Ge dots.

To produce these dots, chemical vapor deposition (CVD) processes are used. Thus, by carefully choosing the deposition parameters, such as the temperature and the pressure and flow rates of precursor gases (typically $SiH_4$ and $GEH_4$, with $H_2$ as the carrier gas), it is possible to deposit Ge dots on a surface of a silicon layers or Si dots on a surface of an $SiO_2$ layer with sizes of quantum boxes. For example, to increase the luminescence efficiency, the quantum box plane thus produced is encapsulated and then a new quantum box plane is deposited on the surface of the encapsulation layer, and so on over several thicknesses.

The production of such quantum boxes in the form of germanium dots is described inter alia in the articles "Deposition of three-dimensional Ge islands on Si (001) by chemical vapor deposition at atmospheric and reduced pressure" by T. I. Kamins, E. C. Carr, R. S. Williams and S. J. Rosner, J. Appl. Phys. Si (1), Jan. 1, 1997 and "Germanium quantum dots" embedded in silicon: Quantitative study of self-alignment and coarsening" by O. Kienzle, F. Ernst, M. Rühle, O. G. Schmidt and K. Eberl, Appl. Phys. Lett. Vol. 74, No 2, Jan. 11, 1999.

Semi-hemispherical quantum boxes have several drawbacks.

The quantum boxes obtained are made of single-crystal material but do not all have the same crystal orientation and may even exhibit microtwins.

The size distribution of the boxes is not well centered and the spacing between the boxes is not completely regular (it depends on the chemical vapor deposition nucleation conditions).

During encapsulation of a plane of quantum boxes, there may be interdiffusion of species from the encapsulation material into the quantum box material.

For example, silicon deposited by CVD at a temperature typically greater than 550° C. in order to encapsulate the Ge quantum boxes in a plane, will tend to diffuse into the germanium of the boxes.

The formation of quantum boxes by chemical vapor deposition, or another deposition technique such as molecular beam epitaxy (MBE), is essentially a problem of nucleation. Nucleation phenomena are often exponential in nature, requiring control of the duration. Nucleation is also highly dependent on the nature and the state of the receiving surfaces and the latency time is often a limiting factor in obtaining reproducible results.

Therefore, a process for producing a stack of silicon and/or germanium or SiGe alloy quantum box planes, which remedies the above drawbacks, may be desired.

In particular, a process may include fabricating a stack of silicon and/or germanium or SiGe alloy quantum boxes that makes it possible to obtain a succession of quantum box planes with well-defined interfaces, the quantum boxes being virtually the same size, single-crystal, and oriented.

In addition, a device may include a stack of silicon and/or germanium or SiGe alloy quantum box planes, the quaritum boxes being virtually the same size, single-crystal, and oriented.

SUMMARY OF THE INVENTION

In an embodiment, a process for fabricating a device having, on a single-crystal silicon or germanium substrate, a stack of quantum box planes, includes:

the formation, on the substrate, of a stack of successive, alternately Si/Ge, Si/SiGe, or Si/SiGe/Ge single-crystal layers in the case of a germanium substrate and conversely in the case of a silicon substrate; and the electrochemical treatment of the stack of single-crystal layers in order to make the layers porous and to form therein residual crystallites constituting quantum boxes.

In another embodiment, after electrochemical treatment, the stack of porous layers is'subjected to a passivation treatment by electrochemical oxidation. The electrochemical oxidation converts the porous Si layers into insulating $SiO_2$ layers so that a structure is obtained in which the Ge or SiGe alloy layers form planes of quantum boxes between insulating $SiO_2$ layers.

In addition, a device may include a single-crystal silicon or germanium substrate and a stack of quantum box planes, which consists of a stack of porous, Si/Ge, Si/SiGe, or Si/SiGe/Ge successive single-crystal layers in the case of a germanium substrate and conversely in the case of a silicon substrate.

In some embodiments, a device includes a single-crystal silicon or germanium substrate and at least one quantum box plane consisting of a porous germanium or SiGe alloy layer between two $SiO_2$ layers.

In one embodiment, the layers of the stack are Si and Ge layers for maximum chemical, electrochemical, and optical effects.

DETAILED DESCRIPTION OF THE INVENTION

The term "porous layer" is understood to mean a layer having a volume porosity of at least 35% and possibly up to 85%. In certain embodiments, the porous layers will have a volume porosity of 50 to 70%.

The formation of the stack of successive Si/Ge, Si/SiGe, or Si/SiGe/Ge single-crystal layers is known per se. The formation of single-crystal layers can be accomplished, for example, by chemical vapor deposition (CVD) or by molecular beam epitaxy (MBE).

For example, it is possible, by CVD using a bulk Si (or Ge) substrate, and after conventional surface cleaning, to grow, by hetero-epitaxy, alternating layers of Si and Ge (or Si and SiGe or Si, SiGe, and Ge) in the same reactor. The CVD process may use suitable precursor gases such as $SiH_4$, $GeH_4$, and mixtures thereof, with $H_2$ as carrier gas and at conventional working temperatures and pressures (for example, a temperature of about 650° C. and a pressure of 2.6 kPa (20 torr)).

Under these conditions, the deposition rate of Si is about 12 nm/minute, that of Ge about 90 nm/minute, and that of a $Si_{0.8}Ge_{0.2}$ alloy about 10 nm/minute.

Thus, in order to obtain very thin Ge and Si layers, it is desirable to use temperatures of about 450° C. and 520° C. respectively.

The Si, Ge, and/or SiGe layers may be n-doped or p-doped without impairing the subsequent pore-forming step. Only the sizes of the pores are, as will be seen below, modified by this doping.

The thicknesses of the layers formed may vary from 1 nm to several microns, but they may be chosen to correspond approximately to the size of the residual crystallites after the porosity has been formed, that is to say typically less than 20 nm.

The Si layers may have a thickness of 2 nm to 1 µm or better still a thickness of 2 nm to about 10 nm. The Ge layers and the layers of SiGe alloys (containing 75% or more by weight Ge) may have a thickness of 2 nm to 300 nm. The layers of SiGe alloys (containing less than 75% by weight Ge) may have a thickness of 3 nm to 50 nm.

As described below, residual crystallites are obtained after electrochemical treatment which have the most "symmetrical" shape possible. The size and shape of the quantum boxes are governed by the layer doping/electrochemical treatment conditions pair, which acts on the formation of the pores, whereas the height will be governed by the thickness of the layer. The crystallites may have a height of about 10 nm.

The CVD deposition of Si, Ge, and SiGe single-crystal layers is described inter alia in French patent No. 97/16631.

A second step of the process may consist of an electrochemical treatment of the multilayer stack in order to create porosity therein.

The formation of pores in single-crystal Si layers is known and described inter alia in the article "Porous silicon: material properties, visible photo- and electroluminescence" by G. Bomchil, A. Halimaoui, I. Sagnes, P. A. Badoz, I. Berbezier, P. Perret, B. Lambert, G. Vincent, L. Garchery and J. L. Regolini, Applied Surface Science 65/66 (1993) 394–407 North-Holland and French Patents No 87/06683 and 87/12913.

It has been found that it is possible to form pores in a similar manner in Ge or SiGe layers, but generally with higher porosities since Ge and SiGe are etched more rapidly than silicon.

For the same treatment conditions, the porosity of germanium layers is approximately 1.3 times greater than that of a silicon layer.

In short, the electrochemical treatment for forming the porous layers may be carried out in the following manner.

The substrate, coated with the multilayer stack, is put into a conventional electrochemical cell in which the substrate acts as the anode, and the cathode is typically a platinum wire.

In an embodiment, the electrolyte is an aqueous HF solution. By adjusting the electrochemical parameters, such as the HF concentration of the electrolyte solution, the voltage and intensity of the current, and the duration of the treatment, the formation of porosity in the layers of the stack may be adjusted.

In most embodiments, residual crystallites constituting quantum boxes of almost identical size will be obtained in the thickness of the etched layers, since the electrochemical reaction is stopped for a given crystallite size. This phenomenon is well known in the case of silicon. An identical phenomenon is observed in the case of germanium and silicon-germanium alloys.

To reduce the size of the residual crystallites, it is possible to use the chemical dissolubility of Si, Ge, and SiGe by the electrolyte (e.g., an aqueous HF solution) by extending the duration of the treatment. However, this reduction in the size of the crystallites is to the detriment of a non-isotropic enlargement of the pores since the dissolution will take place more rapidly on the surface than at the bottom of the pores and over the lower layers.

By modifying the electrochemical treatment conditions during the treatment, it is possible to obtain porosities and crystallites of different sizes within the various layers.

As an example, table 1 gives the porosities of Si and Ge layers 3 µm in thickness for various electrochemical treatment conditions.

TABLE 1

| HF concentration (vol %) | Current density (mA/cm$^2$) | Si porosity (%) | Ge porosity (%) |
|---|---|---|---|
| 25 | 20 | 65 | 84.5 |
| 35 | 20 | 58 | 75.4 |

In addition, by modifying the possible doping of the layers, it is also possible to obtain different porosities and crystallites of different sizes in these layers.

An advantage of the process described above may be that well-defined interfaces between the quantum box planes are obtained. It is also possible to obtain better-controlled and thinner layers, and planes of quantum boxes consisting of two different materials.

In some embodiments, it is possible to take advantage of the difference in behavior between germanium oxide $GeO_2$, and silicon oxide, $SiO_2$. For example, a stack of Ge or GeSi and Si porous layers under electrochemical treatment conditions such that silicon layers having a porosity of approximately 45% by weight may be obtained. Then, by subjecting the multilayer stack in the same electrochemical cell to an electrochemical passivation treatment (for example, an anodic oxidation described in the article "Porous silicon: material properties, visible photo- and electroluminescence" mentioned above), the porous silicon layers are converted into $SiO_2$, while the fraction of germanium oxide or SiGe alloy oxide which may be formed in the Ge and SiGe layers will be dissolved by the aqueous electrolyte solution. This may result in a structure consisting of planes of Ge or SiGe quantum boxes between the $SiO_2$ layers.

Devices produced by the above described embodiments may be useful for producing infrared detectors, Bragg mirrors, and light-emitting diodes.

In the above described process, it is possible to achieve a centered distribution of the quantum boxes, something that is not the case in the previous techniques, in particular those techniques that make use of only porous silicon layers.

Figure 1B:
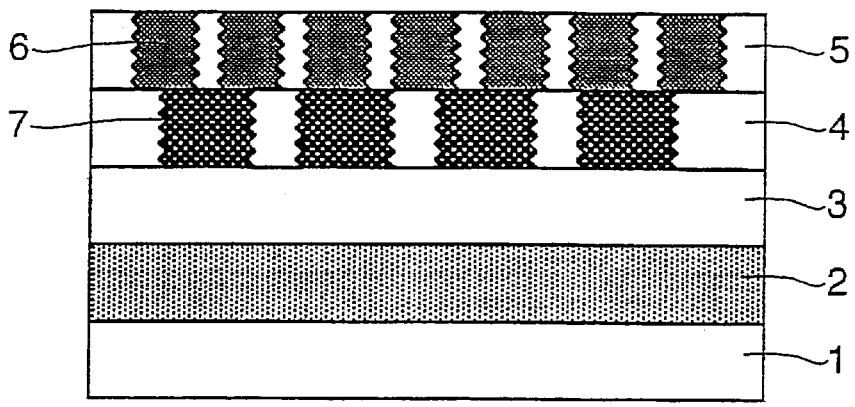
Figure 1C:
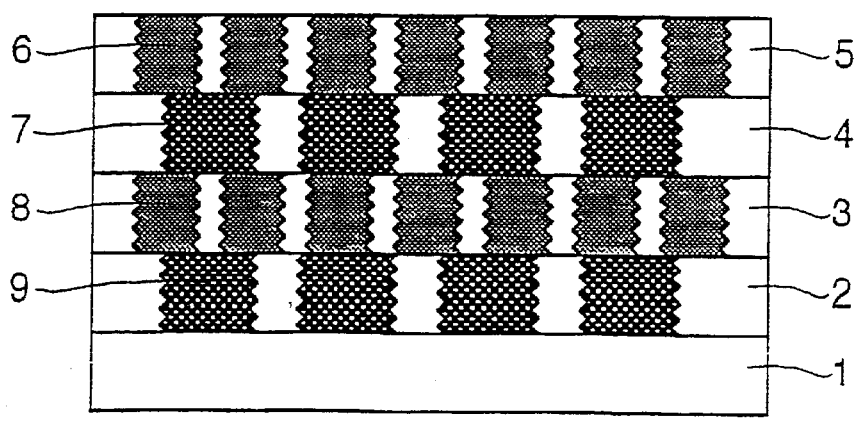
Figure 2:
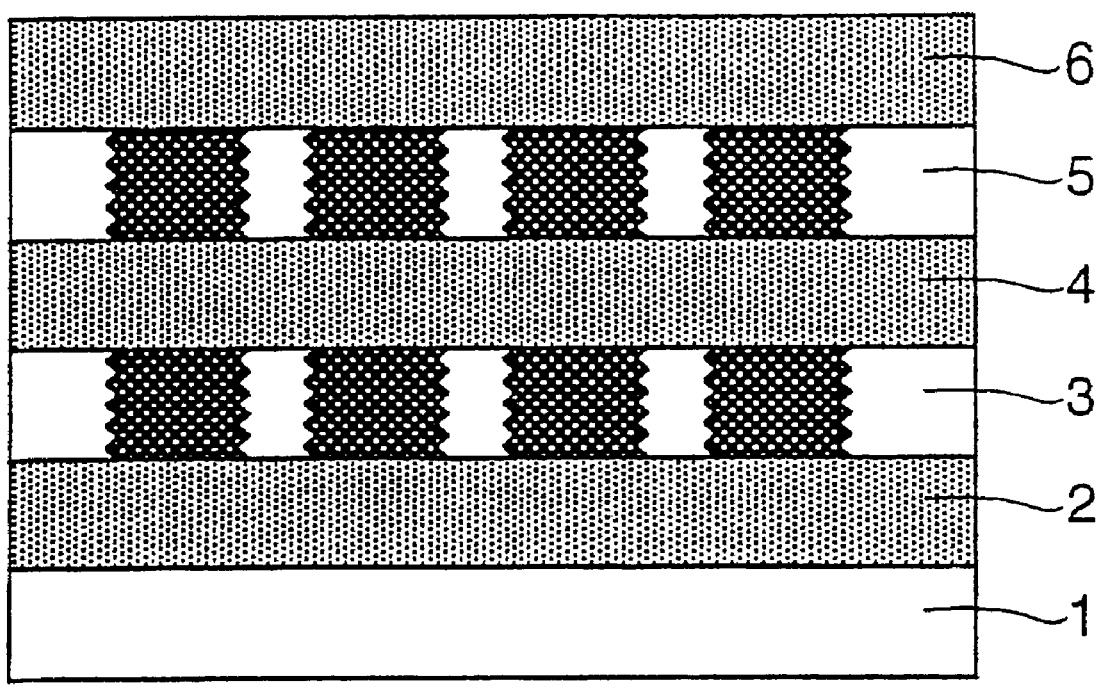

The rest of the description refers to the appended figures, which show, respectively:

FIGS. 1A to 1C depict a schematic representation of the main steps of the process of the invention; and FIG. 2 depicts a schematic representation of a stack according to the invention, after passivation by electrochemical oxidation.

As shown in FIG. 1A, a process may start with the deposition, by conventional CVD on a substrate 1 (for example, made of single-crystal silicon) of a stack of alternating layers (for example, of germanium and silicon). In the case shown, this is a stack of four Ge/Si/Ge/Si layers 2, 3, 4, and 5, with p-type doping, having a thickness of about 10 nm respectively.

The layers were deposited by CVD in the same reactor with the following conditions:

Si Layers:

$SiH_4$ precursor gas flow rate: 400 cm$^3$/minute $H_2$ carrier gas flow rate: 20 l/minute Temperature: 650° C.

Pressure: 2.6 kPa (20 torr);

Ge layers:

$GeH_4$ precursor gas flow rate: 100 cm$^3$/minute $H_2$ carrier gas flow rate: 20 l/minute Temperature: 650° C.

Pressure: 2.6 kPa (20 torr).

The substrate 1 provided with the stack of layers 2 to 5 was then subjected to an electrochemical treatment in a conventional electrochemical cell with a platinum anode. The electrolyte consisted of an aqueous HF solution with an HF concentration of 35% by volume. The current density was 20 mA/cm$^2$.

As FIGS. 1B and 1C show, this electrochemical treatment gradually converts the layers 2 to 5 of the stack into porous layers consisting of residual crystallites 6 to 9. This treatment forms planes of quantum boxes of different types and having well-defined interfaces.

Given that germanium is etched more rapidly than silicon, germanium layers 2 and 4 will have a higher porosity than that of the silicon layers 3 and 5. For example, with the above conditions, the porosity of the silicon layers is 58% by volume and that of the Ge layers approximately 75% by volume.

The residual crystallites, constituting the quantum boxes, are oriented like the substrate and have a size of approximately 10 nm with a very centered distribution.

FIG. 2 shows the structure obtained according to a variant of the process described above. In this variant, the electrochemical treatment step is modified to obtain porous silicon layers having a porosity of about 45% by volume.

An anodic oxidation step is then carried out in the same electrochemical cell, using an electrolyte containing no HF (for example, aqueous HCl or $KNO_3$ solutions) with a current density of 1 to 10 mA/cm$^2$, so as to convert the porous Si layers into non-porous $SiO_2$ layers (4,6). The germanium layers (3,5) remain porous because of the greater sensitivity of germanium oxide in the aqueous medium.

Thus, a stack of germanium quantum box planes is obtained between insulating $SiO_2$ layers.

What is claimed is:

1. A process for fabricating a device comprising a stack of quantum box planes, wherein the process comprises:

forming a stack of successive, alternating single-crystal layers of Si/Ge, Si/SiGe, or Si/SiGe/Ge on a single-crystal germanium substrate or a stack of successive, alternating single-crystal layers of Ge/Si, Ge/SiGe, or Ge/SiGe/Si on a single-crystal silicon substrate; and the electrochemical treatment of the stack of single-crystal layers in order to make the layers porous and to form therein residual crystallites constituting quantum boxes, wherein the porous Ge or SiGe layers have a porosity greater than the Si layers.

2. The process as claimed in claim 1, wherein the porosity of the layers obtained by the electrochemical treatment is from 35 to 85% by volume.

3. The process as claimed in claim 1, wherein the residual crystallites have a size of about 10 nm.

4. The process as claimed in claim 1, wherein forming the stack comprises chemical vapor deposition or deposition by molecular beam epitaxy.

5. The process as claimed in claim 1, wherein the electrochemical treatment is carried out under conditions resulting in porous silicon layers having a porosity of approximately 45% by volume, and the process further comprises an electrochemical oxidation treatment which converts the porous silicon layers into insulating $SiO_2$ layers in order to form Ge or SiGe alloy quantum box planes between $SiO_2$ layers.

6. A device comprising a stack of quantum box planes on a substrate, wherein the quantum box planes consist of successive, alternating porous single-crystal layers of Si/Ge, Si/SiGe, or Si/SiGe/Ge formed on a single-crystal germanium substrate or successive alternating porous single-crystal layers of Ge/Si, Ge/SiGe, or Ge/SiGe/Si formed on a single-crystal silicon substrate, wherein the porous single-crystal layers are formed by electrochemical treatment of a stack of single-crystal layers, and wherein the porosity of a first layer obtained by the electrochemical treatment is substantially different than the porosity of a second layer obtained by the electrochemical treatment.

7. The device as claimed in claim 6, wherein the layers have a porosity of 35 to 85% by volume.

8. A device comprising at least one quantum box plane formed in a germanium or SiGe alloy layer between two $SiO_2$ layers.

9. The process as claimed in claim 1, wherein the porosity of the layers obtained by the electrochemical treatment is from 50 to 70% by volume.

10. The process as claimed in claim 1, wherein the porosity or a first layer obtained by the electrochemical treatment is substantially different than the porosity of a second layer obtained by the electrochemical treatment.

11. The process as claimed in claim 1, wherein the residual crystallites are oriented with the substrate.

12. The device as claimed in claim 6, wherein the layers have a porosity of 50 to 70% by volume.

13. A method for fabricating a device comprising:

forming a stack of successive, alternating single-crystal layers of Si/Ge, Si/SiGe, or Si/SiGe/Ge on a single-crystal germanium substrate or a stack of successive, alternating single-crystal layers of Ge/Si, Ge/SiGe, or Ge/SiGe/Si on a single-crystal silicon substrate;

electrochemically treating the stack of alternating single-crystal layers to make the single-crystal layers porous; and electrochemically oxidizing the porous single-crystal layers, which converts the porous silicon layers into insulating $SiO_2$ layers and forms Ge or SiGe alloy quantum box planes between the $SiO_2$ layers.

14. The method of claim 13, wherein the porous single-crystal layers comprise a porosity between 35% and 85% by volume.

15. The method of claim 13, further comprising forming residual crystallites constituting quantum boxes in the single-crystal layers from the electrochemical treatment of the stack of alternating single-crystal layers.

16. The method of claim 15, wherein the residual crystallites are oriented with the substrate.

17. The method of claim 13, wherein forming the stack of alternating single-crystal layers comprises chemical vapor deposition or molecular beam epitaxy.

18. The method of claim 13, wherein the porous silicon layers comprise a porosity of about 45% by volume, the method further comprising electrochemically oxidizing the porous single-crystal layers, which converts the porous silicon layers into insulating $SiO_2$ layers and forms Ge or SiGe alloy quantum box planes between the $SiO_2$ layers.

* * * * *